(12) United States Patent  (10) Patent No.: US 6,246,107 B1
Silvestre  (45) Date of Patent: Jun. 12, 2001

(54) SEMICONDUCTOR DEVICE ARRANGEMENT HAVING CONFIGURATION VIA ADJACENT BOND PAD CODING

(75) Inventor: Philippe Silvestre, Callian (FR)

(73) Assignee: Philips Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 09/348,793

(22) Filed: Jul. 7, 1999

(51) Int. Cl.[7] .................................................. H07L 23/495
(52) U.S. Cl. .......................... 257/666; 257/692; 257/782
(58) Field of Search ................................... 257/666, 782, 257/784, 690, 691, 692

(56) References Cited

U.S. PATENT DOCUMENTS

| | | | |
|---|---|---|---|
| 3,478,229 | 11/1969 | Avery | 307/205 |
| 3,648,116 | 3/1972 | Baugher et al. | 317/101 A |
| 4,558,345 | 12/1985 | Dwyer et al. | 357/68 |
| 5,066,831 | 11/1991 | Spielberger et al. | 357/74 |
| 5,161,124 | 11/1992 | Love | 361/222 |
| 5,258,890 | 11/1993 | de Veer | 361/783 |
| 5,264,664 | 11/1993 | McAllister | 361/777 |
| 5,334,866 | 8/1994 | Kubo | 257/207 |
| 5,418,455 | 5/1995 | Takaishi et al. | 324/207.21 |
| 5,455,460 | 10/1995 | Hongo et al. | 257/734 |
| 5,585,676 | 12/1996 | Uda et al. | 257/786 |
| 5,646,451 | 7/1997 | Freyman et al. | 257/784 |
| 5,675,178 | 10/1997 | Lindley | 257/666 |
| 5,698,903 | 12/1997 | Parris et al. | 257/786 |
| 5,701,234 | 12/1997 | Wong | 361/773 |
| 5,703,759 | 12/1997 | Trimberger | 361/777 |
| 5,754,879 | 5/1998 | Johnston | 395/800.39 |
| 5,763,298 | 6/1998 | Parris et al. | 438/128 |
| 5,805,428 | 9/1998 | Singer | 361/777 |
| 6,008,073 | * 12/1999 | King et al. | 438/123 |
| 6,008,533 | * 12/1999 | Bruce et al. | 257/691 |
| 6,087,713 | * 7/2000 | Haruta | 257/666 |
| 6,097,098 | * 8/2000 | Ball | 257/692 |
| 6,104,084 | * 8/2000 | Ishio et al. | 257/666 |

* cited by examiner

*Primary Examiner*—Don Wong
*Assistant Examiner*—Thuy Vinh Tran

(57) ABSTRACT

According to an example embodiment, the present invention is directed to a configurable semiconductor device wherein the placement of bond wires and bonding pads are assembled to bond internal configuration pads at the die level. One aspect of the invention is a multiple-configuration semiconductor device that includes a die package for housing a die including functional bonding pads and including target bonding pads that are immediately adjacent to one another and designated to be connected to power or common depending on a desired configuration. A bonding wire circuit includes a first plurality of bonding wires respectively connecting the functional bonding pads to selected lead fingers, and further includes a second plurality of bonding wires connecting each of at least two of the immediately-adjacent target bonding pads to power or common. The connection of the immediately-adjacent target bonding pads to power or common determines the desired configuration of the multiple-configuration semiconductor device.

22 Claims, 1 Drawing Sheet

SEMICONDUCTOR DEVICE ARRANGEMENT HAVING CONFIGURATION VIA ADJACENT BOND PAD CODING

FIELD OF THE INVENTION

This invention relates to the placement of bond wires and bonding pads in a semiconductor die assembly associated with a configurable integrated circuit package.

BACKGROUND

Semiconductor devices communicate with their environment of use by accepting electrical impulses supplied by an external source (such as a circuit board) and conducting these impulses to electrical circuits contained on a semiconductor chip. The semiconductor chip reacts to the input in a predetermined manner to generate output. The input and output of electrical impulses to the semiconductor device occur over multiple paths of electrically conducting material, generally referred to as leads.

The traditional structure of one of these devices consists of having a semiconductor die with an edge having a row of individual bonding pads regularly spaced and arrayed at the periphery of one edge of the semiconductor die. A pattern of individual leads is also present that are usually secured to an external IC package or structure. Individual bond wires normally connect a single lead to an individual bond pad. In a traditional embodiment the pattern of individual leads, each of the leads corresponds to one of the bonding pads and is substantially perpendicular to the edge of the die. In other approaches, bonding pads are included along one or more perimeter edges of the semiconductor die.

As semiconductor chips have decreased in size, one of the limiting factors has been the number of available I/O pathways for a given chip. As lead and lead frame technology has progressed, it has been desirable to maximize the number of individual leads that are available in a lead frame. To effectively increase the number of I/O pathways, both the lead count and the number of bonding pads are typically increased. This conflicts with the fact that the die size remains the same and that the leads cannot short with each other leads even when the number of bonding pads have been increased by creating an inner row of bonding pads. This approach leads to devices having higher pin count, which renders a more difficult to design and manufacturing process with little return for the investment.

With the evolution of the consumer market, silicon manufacturers have to provide many different devices belonging to the same family architecture to allow OEM or end customers to build attractive products with up-to-date features. With the market evolving quickly with dropping prices, it is not possible to offer all features on a single chip device because the pin count would become high and the device price too expensive. The common way to avoid a high pin count is to multiplex interfaces. Generally, the multiplexing control is accomplished by coding a configuration on dedicated device pins connected externally to Vdd (source) or Vss (ground).

By fabricating integrated circuits that can be configured into any of several different functional products, manufacturers seek to capitalize on a number of advantages. Multi-configurable integrated circuits permit greater flexibility in meeting customer design requirements. Such circuits also allow reduced tooling and fabrication costs—as some of the steps which would be duplicated during production of separate functional products can be eliminated by producing a single, multi-configurable integrated circuit. The multi-configurable integrated circuit also reduces the necessity to keep a large inventory of several functionally-different integrated circuit reticle sets on hand so as to meet the customer's needs.

When selecting a particular function or operating mode of a multi-function device, a variety of hook-up arrangements may be used, including: electrically connecting two or more bonding pads together, omitting specific connections, and transposing certain connections. Connecting two or more bonding pads typically involves connecting each pad individually to its respective lead by a connector wire, and then tying the two leads together with a jumper wire outside of the device package. Such an approach requires that two connector wires and two leads be provided for each pair of pads that are interconnected, and that the connector wires be routed over undesirable circuit areas. Consequently, the device is less reliable because of the additional connections, the excessive number of internal bond points and amount of connector wires; further, the device has a reduced number of functioning leads that may be brought out of the package.

Developing a cost-effective multi-configurable IC would be advantageous if the IC could increase the manufacturer's ability to use the same die for multiple uses without degrading the IC's functionality or integrity. In the IC market for wireless communication, for example, a first configuration of a multi-configurable IC device could be dedicated for a handset communicator application and a second configuration of the same multi-configurable IC device could be dedicated for a base communicator application. In another example, a multi-configurable IC device could be used for a handset device having a keypad scanning interface, and the same multi-configurable IC device could be sold with an altered configuration as a base communicator device having a telephone-answering machine function.

Accordingly, there is need for a cost-effective multi-configurable IC that overcomes the issues and problems discussed above.

SUMMARY OF THE INVENTION

Various aspects of the present application are directed to a multi-configurable semiconductor device and method for configuring such a device using target bonding pads on the die, with each of the target bonding pads being immediately-adjacent to another so as to minimize wire-length and routing paths when connecting the target bonding pads for the die's configuration.

According to an example embodiment, the present invention involves a multiple-configuration semiconductor device that includes a die package containing a pad-configurable die. The die has a plurality of bonding pads, including functional bonding pads and target bonding pads, and each of the target bonding pads is immediately adjacent to another of the target bonding pads and is designated to be connected to power or common (e.g., Vdd or Vss) depending on a desired configuration. The die package secures the die and includes leads for electrically connecting die circuitry to an external device. A plurality of lead fingers is configured to be contained within the die package, and the lead fingers are arranged to connect with the leads with the plurality of bonding pads. A bonding wire circuit includes a first plurality of bonding wires respectively connecting the functional bonding pads to selected lead fingers, and further includes a second plurality of bonding wires connecting each of at least two of the immediately-adjacent target bonding pads to Vdd or Vss. The connection of the immediately-adjacent target bonding pads to Vdd or Vss determines the desired configuration of the multiple-configuration semiconductor device.

In a more specific embodiment, the multiple-configuration semiconductor device, as characterized above, has a first target bond pad designated to be connected to Vdd or Vss, a second target bond pad designated to be connected to the other of Vdd or Vss, and a configuration target bond pad designated to be connected to Vdd for one circuit configuration and designated to be connected to the other of Vss for another circuit configuration. The configuration target bond pad is located between the first target bond pad and the second target bond pad.

Another aspect of the present invention is directed to a method for configuring the type of multiple-configuration semiconductor device characterized above or a similar-type device. The method includes providing a die with a plurality of bonding pads, including functional bonding pads and target bonding pads, wherein each of the target bonding pads is immediately adjacent to another of the target bonding pads and is designated to be connected to Vdd or Vss depending on a desired configuration. The die is supported and enclosed in a die package that includes leads for electrically connecting the die circuitry with an external device. The functional bonding pads are connected to selected lead fingers, and each of at least two of the immediately-adjacent target bonding pads are connected to Vdd or Vss, wherein the connection of the immediately-adjacent target bonding pads to Vdd or Vss determines the desired configuration of the multiple-configuration semiconductor device.

The above summary is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodimetns of the invention in connection with the accompanying drawings, in which.

Figure 1:
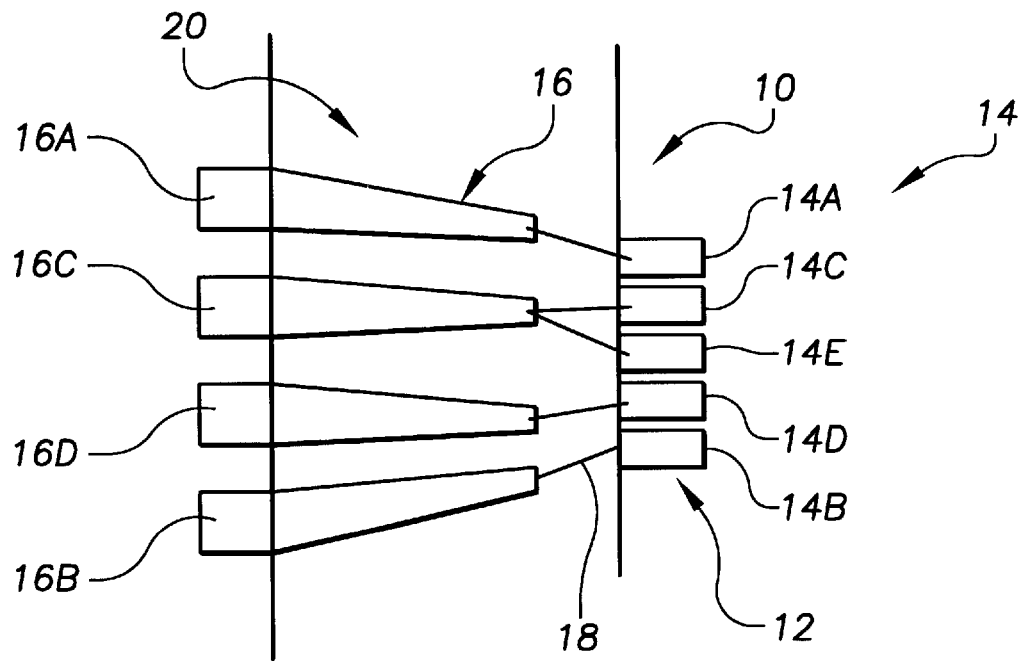
FIG. 1 shows a configuration pad connected by bonding to VDD.

While the invention is amenable to various modifications and alternate forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE INVENTION

The present invention is applicable to a semiconductor die assembly that is contained within a semiconductor package for a lead system. Applicable packages include but are not necessarily limited to dual in-line packages (DIP), quad packages, pin grid array (PGA) packages, ball grid array (BGA) packages, flat packs and surface mount devices (SMDs). These packages can be made of plastic, ceramic or other suitable material. The multi-configurable IC device of this invention can be manufactured separately from these packages, as part of a lead frame or lead system, and then integrated into the semiconductor package.

As shown in FIG. 1, the semiconductor device includes a die 10 having uniformly spaced bonding pads 14 on surface of die 10. The bonding pads are connected to a pattern of individual leads (or lead fingers) 16 using, for example, wire bonding methods (including printed conductors). Wire bonding generally requires that a thin, electrically-conductive bond wire 18 (part of a bonding wire circuit) be electrically-bonded at one end to a single lead 16 and at the opposite end to a single bond pad 14 of die 10. The device further includes a die package 20 that supports the entire semiconductor device for IC manufacturing and that includes leads for electrically connecting die circuitry with an external device. Lead fingers 16 are configured to be secured by die package 20 and are arranged to associate the leads with the bonding pads 12.

In the example embodiment disclosed in FIG. 1, lead fingers 16a and 16b are functional lead fingers for purposes of passing I/O and control data between the IC and an external device. The lead finger 16c is for the VDD and lead finger 16d is for the VSS. The lead fingers 16c and 16d are placed adjacent to one another to minimize routing in connection with the die configuration aspect of the present invention.

The device has a series of bonding pads 14a–14e that are associated with the lead fingers 16. Lead fingers 16a and 16b are electrically connected to pads 14a and 14b, while VDD finger 16c is connected to pad 14c and VSS finger is connected to 14d. According to one example implementation of the present invention, device differentiation is achieved by a bonding configuration internal to the device. A configuration pad 14e is provided on the die that is located between and adjacent to corresponding VDD pad 14c and VSS pad 14d. The configuration coding is then performed during the assembly process by connecting configuration pad 14e to VDD lead 16c via a bonding wire 18.

Figure 2:
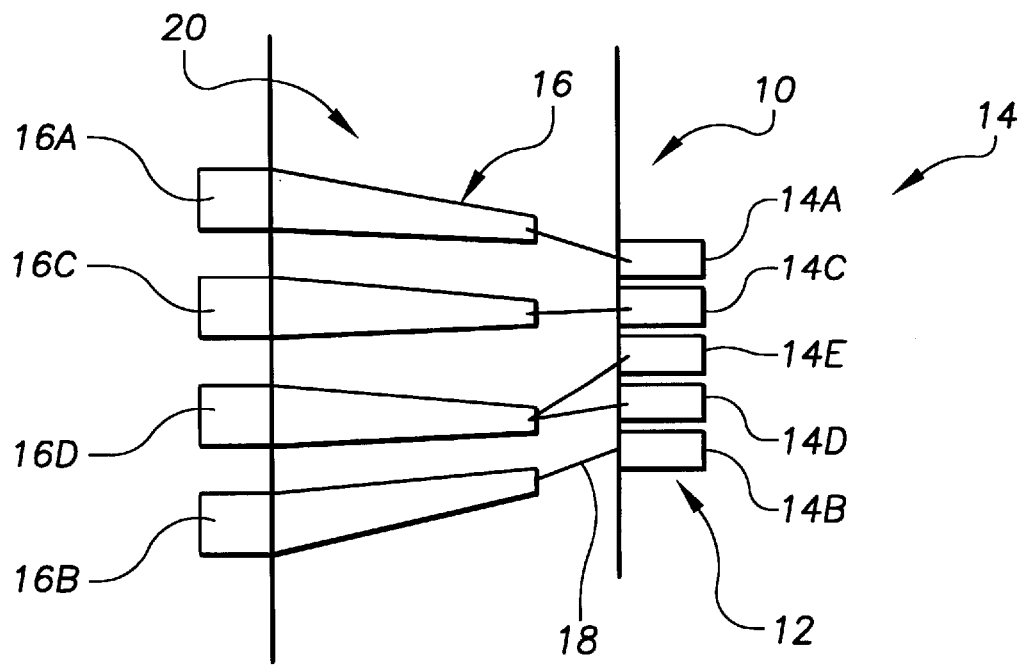
FIG. 2 shows the same configuration pad bonded to VSS of another application.

In another application of the present invention, FIG. 2 discloses a device having elements that are substantially similar to the elements of the device described in FIG. 1. In this embodiment, the configuration coding is performed during the assembly process by connecting configuration pad 14e to VSS lead 16d, with the configuration of the die 14 altered accordingly. Applying this scenario to the previously-discussed examples for wireless communication, the first configuration, as depicted in FIG. 1, programs the die 14 for a handset communicator application (having a keypad scanning interface), and the second configuration, as depicted in FIG. 2, programs the same die 14 for a base communicator application (having a telephone-answering machine function).

In yet another application of the present invention, first and second bonding pad configurations are used to differentiate whether a semiconductor die accesses a first or second memory type (e.g., one Mbyte or two Mbyte memory die). In this manner, the semiconductor die can include a CPU and the bonding pad configuration can be read by the CPU to indicate which memory type is available.

In other implementations of the present invention, each of the leads 16c and 16d, is connected initially to pad 14e. In the assembly process, before sealing the die 14 in the die package 20, one of the wire bonds is disconnected (e.g., cut or removed) so that the desired configuration results.

In yet another application of the present invention, the illustrated lead fingers have a tapered central region, with one end being widened and the other being narrowed. The widened end connects to the leads while the narrowed end connects to the bonding pads.

An example method of forming and configuring a multi-configurable device includes providing a semiconductor die 10, forming a series of bonding pads 12 on die 10, and providing corresponding lead fingers 16 that are electrically connected to a corresponding individual bond pad 14 of bonding pads 12. The lead fingers include a lead finger for the Vdd I/O and one for the Vss I/O. From one of the lead fingers (either Vdd or Vss), an additional wire electrically connects it to a configuration pad that is part of the bonding pads 12.

In other example embodiments, the lead fingers and pads described in the above embodiments can be multiplied and located at the edge of die 10 as well as around the entire periphery of die 10. This may require that the lead fingers be located at an angle to the edge of the die due to the density issue, the angle being from 0 degrees to over 45 degrees from perpendicular in order to be coupled to the pad on the die. The bonding pads can also be set up in two rows, adjacent the edge of the die, including an inner row and an outer row that may need to be bonded to a lead finger system. Finally, these pads can be either evenly-spaced or variably-spaced with respect to each row or as a single row on the die.

Accordingly, the present invention provides, among other aspects, a multi-configurable semiconductor device that allows for OEM or final device differentiation by providing for a bonding configuration internal to the device. The configuration is done easily during the assembly process without necessarily requiring user coding or software control; however, the skilled artisan will appreciate that such control or automation is an option that can be included with such embodiments. Other aspects and embodiments of the present invention will be apparent to those skilled in the art for consideration of the specification and practice of the invention disclosed herein. It is intended that the specification and illustrated embodiments be considered as exemplary only, with a true scope and spirit of the invention being indicated by the following claims.

What is claimed is:

1. A multiple-configuration semiconductor device, comprising:
   a die with a plurality of bonding pads, including functional bonding pads and target bonding pads, the target bonding pads including a first target bond pad that is designated to be connected to power, a second target bond pad designated to be connected to common, and a configuration target bond pad designated to be connected to one of a plurality of voltage references for one circuit configuration and designated to be connected to another of plurality of voltage references for another circuit configuration;
   a die package adapted to secure the die and including leads for electrically connecting die circuitry to an external device;
   a plurality of lead fingers configured to be contained within the die package, the lead fingers arranged to connect with the leads with the plurality of bonding pads; and
   a connection circuit also adapted to be contained within the die package, the connection circuit including a first plurality of connectors respectively connecting the functional bonding pads to selected lead fingers and further including a second plurality of connectors connecting each of at least two of the immediately-adjacent target bonding pads to power or common, wherein said configuration target bonding pad is initially connected to power and common to permit removal of one of said connections for the desired configuration of the multiple-configuration semiconductor device.

2. A multiple-configuration semiconductor device, according to claim 1, wherein each of the plurality of bonding pads is separated from an immediately-adjacent bond pad by a uniform distance.

3. A multiple-configuration semiconductor device, according to claim 1, wherein the functional bonding pads include pads for passing data between the die circuitry and circuitry external to the die package.

4. A multiple-configuration semiconductor device, according to claim 1, wherein the connection of said at least one target bonding pad to power or common determines the desired configuration of the multiple-configuration semiconductor device and the configuration target bond pad is located between the first target bond pad and the second target bond pad.

5. A multiple-configuration semiconductor device, according to claim 1, wherein the one target bonding pad is connected to indicate that a programmed feature is to be enabled.

6. A multiple-configuration semiconductor device, according to claim 1, wherein the one target bonding pad is connected to indicate a memory configuration.

7. A multiple-configuration semiconductor device, according to claim 1, wherein each of the plurality of lead fingers includes a narrowed end adapted to electrically connect with the die pads.

8. A multiple-configuration semiconductor device, according to claim 1, wherein each of the plurality of lead fingers includes a widened end adapted to electrically connect with the leads and a narrowed end adapted to electrically connect with the die pads.

9. A multiple-configuration semiconductor device, according to claim 1, wherein each of the plurality of lead fingers includes a tapered central region, a widened end adapted to electrically connect with the leads, and a narrowed end adapted to electrically connect with the die pads.

10. A multiple-configuration semiconductor device, according to claim 1, wherein the second plurality of bonding wires connects at least two of the target bonding pads to one of the Vdd bond pad and the Vss bond pad.

11. A multiple-configuration semiconductor device according to claim 10, wherein the functional bonding pads include I/O pads.

12. A multiple-configuration semiconductor device according to claim 1, wherein the one target bonding pad is located adjacent to and between first and second target bonding pads.

13. A multiple-configuration semiconductor device according to claim 12, wherein the first target bonding pad is connected to power and the second target bonding pad is connected to common.

14. A multiple-configuration semiconductor device, comprising:
   a die with a plurality of bonding pads, including functional bonding pads and target bonding pads, each of the target bonding pads being immediately adjacent to another of the target bonding pads and being designated to be connected to power or common depending on a desired configuration, the target bonding pads including a first target bond pad that is designated to be connected to power, a second target bond pad designated to be connected to common, and a configuration target bond pad designated to be connected to first of a plurality of voltage references for one circuit configuration and designated to be connected to another of plurality of voltage references for another circuit configuration;

die packaging means for packaging the die, the die packaging means including leads for electrically connecting die circuitry to an external device;

lead-connecting means, secured by the die package, for connecting with the selected ones of the plurality of bonding pads; and conductor-connecting means, within the die package, for respectively connecting the functional bonding pads to selected ones of the lead-connecting means; and conductor-programming means, within the die package, for connecting each of at least two of the immediately-adjacent target bonding pads to power or common, wherein the configuration target bond pad is initially connected to power and common to the desired configuration of the multiple-configuration semiconductor device.

15. A method for configuring a multiple-configuration semiconductor device, comprising:

providing a die with a plurality of bonding pads, including functional bonding pads and target bonding pads, each of the target bonding pads being designated to be connected to power or common depending on a desired configuration, the target bonding pads including a first target bond pad that is designated to be connected to power or common, a second target bond pad designated to be connected to the other of power or common, and a configuration target bond pad designated to be connected to a first voltage reference for one circuit configuration and designated to be connected to another voltage reference for another circuit configuration;

packaging the die in a die package that includes leads for electrically connecting the die circuitry with an external device;

connecting the functional bonding pads to selected lead fingers;

connecting each of at least two of the immediately-adjacent target bonding pads to power or common, wherein the connection of the immediately-adjacent target bonding pads to power or common determines the desired configuration of the multiple-configuration semiconductor device; and further including initially connecting the configuration target bond pad to both Vdd and Vss and then subsequently disconnecting the configuration target bond pad from one of Vdd and Vss for the desired configuration.

16. A method for configuring a multiple-configuration semiconductor device, according to claim 15, wherein the configuration target bond pad is located between the first target bond pad and the second target bond pad.

17. A method for configuring a multiple-configuration semiconductor device, according to claim 15, further including using bonding wire for connecting the functional bonding pads to selected lead fingers.

18. A method for configuring a multiple-configuration semiconductor device, according to claim 15, wherein connecting each of at least two of the immediately-adjacent target bonding pads to power or common includes connecting one of the immediately-adjacent target bonding pads to one of power or common and another of the immediately-adjacent target bonding pads to the other of power or common.

19. A method for configuring a multiple-configuration semiconductor device, according to claim 15, wherein connecting each of at least two of the immediately-adjacent target bonding pads to power or common includes connecting one of the immediately-adjacent target bonding pads to one of power or common and two other of the immediately-adjacent target bonding pads to the other of power or common.

20. A multiple-configuration semiconductor device, comprising:

a die with a plurality of bonding pads, including functional bonding pads and target bonding pads with a first target bond pad being designated to be connected to power, a second target bond pad being designated to be connected to common, and a configuration target bond pad being designated to be connected to Vdd for one circuit configuration and designated to be connected to the other of Vss for another circuit, each of the target bonding pads being immediately adjacent to another of the target bonding pads and at least one being designated to be connected to power or common depending on a desired configuration, and the functional bonding pads including pads for passing data between the die circuitry and circuitry external to the die package;

a die package adapted to secure the die and including leads for electrically connecting die circuitry to an external device;

a plurality of lead fingers configured to be contained within the die package, the lead fingers arranged to connect with the leads with the plurality of bonding pads;

a bonding wire circuit also adapted to be contained within the die package, the bonding wire circuit including a first plurality of bonding wires respectively connecting the functional bonding pads to selected lead fingers and further including a second plurality of bonding wires connecting each of at least two of the immediately-adjacent target bonding pads to power or common, wherein the connection of said at least one target bonding pad to power or common determines the desired configuration of the multiple-configuration semiconductor device.

21. A method for configuring a multiple-configuration semiconductor device, comprising:

providing a die with a plurality of bonding pads, including functional bonding pads and target bonding pads, each of the target bonding pads being immediately adjacent to another of the target bonding pads, and the target bonding pads including a first target bond pad that is designated to be connected to power or common, a second target bond pad designated to be connected to the other of power or common, and a configuration target bond pad designated to be connected to Vdd for one circuit configuration and designated to be connected to the other of Vss for another circuit configuration, wherein the configuration target bond pad is located between the first target bond pad and the second target bond pad;

packaging the die in a die package that includes leads for electrically connecting the die circuitry with an external device;

connecting the functional bonding pads to selected lead fingers; and connecting each of at least two of the immediately-adjacent target bonding pads to power or common, wherein the connection of the immediately-adjacent target bonding pads to power or common determines the desired configuration of the multiple-configuration semiconductor device.

22. A method for configuring a multiple-configuration semiconductor device, according to claim 21, further including initially connecting the configuration target bond pad to both Vdd and Vss and then subsequently disconnecting the configuration target bond pad from one of Vdd and Vss for the desired configuration.

* * * * *